(12) United States Patent
Pares

(10) Patent No.: US 11,063,172 B2
(45) Date of Patent: Jul. 13, 2021

(54) METHOD FOR PRODUCING A DEVICE WITH LIGHT EMITTING AND/OR LIGHT RECEIVING DIODES AND WITH SELF-ALIGNED COLLIMATION GRID

(71) Applicant: Commissariat A L'Energie Atomique et aux Energies Alternatives, Paris (FR)

(72) Inventor: Gabriel Pares, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 13 days.

(21) Appl. No.: 16/705,428

(22) Filed: Dec. 6, 2019

(65) Prior Publication Data

US 2020/0194614 A1    Jun. 18, 2020

(30) Foreign Application Priority Data

Dec. 13, 2018 (FR) ..................... 18 72886

(51) Int. Cl.
*H01L 33/38* (2010.01)
*H01L 33/00* (2010.01)
(Continued)

(52) U.S. Cl.
CPC ........ *H01L 33/007* (2013.01); *H01L 27/1462* (2013.01); *H01L 27/14625* (2013.01);
(Continued)

(58) Field of Classification Search
CPC ............... H01L 33/007; H01L 33/0093; H01L 27/1462; H01L 27/14625; H01L 27/14643;
(Continued)

(56) References Cited

U.S. PATENT DOCUMENTS

| 6,207,532 B1 * | 3/2001 | Lin ................... | H01L 21/76232 |
| | | | 257/E21.549 |
| 7,646,062 B2 * | 1/2010 | Yamaoka .......... | H01L 29/66553 |
| | | | 257/349 |

(Continued)

FOREIGN PATENT DOCUMENTS

| EP | 3 024 030 A1 | 5/2016 |
| WO | WO 2014/105403 A1 | 7/2014 |
| WO | WO 2017/068029 A1 | 4/2017 |

OTHER PUBLICATIONS

French Preliminary Search Report dated Oct. 4, 2019 in French Application 18 72886 filed on Dec. 13, 2018 (with English Translation of Categories of Cited Documents), 2 pages.

(Continued)

*Primary Examiner* — Vu A Vu
(74) *Attorney, Agent, or Firm* — Oblon, McClelland, Maier & Neustadt, L.L.P.

(57) ABSTRACT

A method is provided for producing a device with light emitting/light receiving diodes, including: producing, on a substrate, a stack including first and second doped semiconductor layers; first etching of the stack, forming first openings through the entire thickness of the second layer; producing dielectric portions covering, in the first openings, the side walls of the second layer; second etching of the stack, extending the first openings until reaching the substrate, delimiting the p-n junctions of the diodes; etching extending the first openings into a part of the substrate; producing first electrically conductive portions in the first openings, forming first electrodes of the diodes, and producing second electrodes electrically connected to the second layer; and eliminating the substrate, forming a collimation grid.

14 Claims, 6 Drawing Sheets

(51) Int. Cl.
| | | |
|---|---|---|
| *H01L 27/146* | (2006.01) | |
| *H01L 27/15* | (2006.01) | |
| *H01L 31/0216* | (2014.01) | |
| *H01L 31/0224* | (2006.01) | |
| *H01L 31/0232* | (2014.01) | |
| *H01L 31/18* | (2006.01) | |
| *H01L 33/44* | (2010.01) | |
| *H01L 33/58* | (2010.01) | |
| *H01L 31/105* | (2006.01) | |
| *H01L 33/06* | (2010.01) | |
| *H01L 33/14* | (2010.01) | |
| *H01L 33/32* | (2010.01) | |

(52) U.S. Cl.
CPC .. *H01L 27/14643* (2013.01); *H01L 27/14685* (2013.01); *H01L 27/156* (2013.01); *H01L 31/02161* (2013.01); *H01L 31/02327* (2013.01); *H01L 31/022408* (2013.01); *H01L 31/1892* (2013.01); *H01L 33/0093* (2020.05); *H01L 33/38* (2013.01); *H01L 33/44* (2013.01); *H01L 33/58* (2013.01); *H01L 31/105* (2013.01); *H01L 33/0012* (2013.01); *H01L 33/06* (2013.01); *H01L 33/145* (2013.01); *H01L 33/32* (2013.01); *H01L 2933/0016* (2013.01); *H01L 2933/0025* (2013.01); *H01L 2933/0058* (2013.01)

(58) Field of Classification Search
CPC ............. H01L 27/14685; H01L 27/156; H01L 31/02161; H01L 31/022408; H01L 31/02327; H01L 31/1892; H01L 33/38; H01L 33/44; H01L 33/58; H01L 31/105; H01L 33/0012; H01L 33/06; H01L 33/145; H01L 33/32; H01L 2933/0016; H01L 2933/0025; H01L 2933/0058; H01L 27/1463; H01L 27/14629; H01L 27/1464; H01L 33/60; H01L 33/405; H01L 33/385; H01L 33/382; H01L 33/62; H01L 31/18; H01L 27/153; H01L 27/1446; H01L 33/46
USPC ......................................................... 438/29
See application file for complete search history.

(56) References Cited

U.S. PATENT DOCUMENTS

| | | | | |
|---|---|---|---|---|
| 7,998,808 | B2 * | 8/2011 | Viswanathan | H01L 29/407 438/243 |
| 8,338,908 | B2 * | 12/2012 | Tsukihara | H01L 21/76224 257/501 |
| 8,653,540 | B2 * | 2/2014 | Engl | H01L 33/382 257/81 |
| 8,691,661 | B2 * | 4/2014 | Mehrotra | H01L 21/3086 438/427 |
| 8,791,009 | B2 * | 7/2014 | Farooq | H01L 21/6835 438/618 |
| 9,263,655 | B2 * | 2/2016 | Hoeppel | H01L 33/025 |
| 9,711,694 | B2 * | 7/2017 | Robin | H01L 33/502 |
| 9,741,912 | B2 * | 8/2017 | Hoeppel | H01L 33/60 |
| 9,947,847 | B2 * | 4/2018 | Hahn | H01L 31/0203 |
| 2012/0007133 | A1 | 1/2012 | Cho et al. | |

OTHER PUBLICATIONS

Martinez, M, et al., "Mechanisms of copper direct bonding observed by in-situ and quantitative transmission electron microscopy", Thin Solid Films 530 (2013), pp. 96-99.

\* cited by examiner

METHOD FOR PRODUCING A DEVICE WITH LIGHT EMITTING AND/OR LIGHT RECEIVING DIODES AND WITH SELF-ALIGNED COLLIMATION GRID

TECHNICAL FIELD AND PRIOR ART

The invention relates to the field of devices with light emitting diodes, such as LEDs, or micro-LEDs, and/or with light receiving diodes, such as photodiodes. The invention notably applies to the following fields:
- lighting devices by LEDs, electronic devices including matrices of LEDs such as screens, projectors or image walls;
- electronic or microelectronic photoreceptor devices comprising matrices of photodiodes, such as image sensors;
- devices comprising both light emitting diodes and light receiving diodes, forming for example both a sensor and a screen.

In devices with light emitting and/or light receiving diodes, it is advantageous to increase the resolution of these devices, that is to say to increase the number of active cells, or pixels, per surface unit of the device. This increase in resolution involves both decreasing the unit size of the pixels and improving the optical separation between the pixels to decrease notably cross-talk, that is to say optical interferences taking place between adjacent pixels. In the case of pixels including light emitting diodes, the increase in their directivity also participates in the increase in the resolution that can be obtained.

Moreover, this increase in resolution must be achieved while limiting losses linked to the sensitivity of reception and/or emissivity of the devices, which implies that the reduction in the useful or sensitive surface of the pixels, that is to say the reception and/or emission surface of the pixels, is accompanied by a reduction in the surface of the peripheral dead zones, that is to say the surface not emitting or not receiving light, which correspond for example to the regions occupied by the electrodes of the diodes and by the insulation regions localised between and around the pixels. This reduction in the surface of the peripheral dead zones involves minimising their width around the pixels while maintaining or improving the optical separation between the pixels.

In current devices, obtaining good performances requires producing an element for optically separating the pixels, arranged above the emissive and/or receiving face of the pixels. Such an optical separation element of the pixels, called collimation grid or separation grid, makes it possible to avoid parasitic reflections between neighbouring pixels and, in the case of a photoemitter device, to improve the directivity of light emission.

Generally, the collimation grid is transferred on top of the pixels, after their production. In order not to limit the useful surface of the pixels and to obtain good performances, the walls forming the collimation grid are produced as thinly as possible, for example with a width less than around 5 µm for pixels each having a useful surface of which the sides have a dimension (width) equal to around 40 µm, and with an important height, for example greater than around 10 µm. Such dimensions lead to the collimation grid having a high aspect ratio (height/width ratio), for example greater than 2. Moreover, the verticality, the low roughness and good reflectivity of the walls make it possible to obtain a collimation grid that does not disturb the reflection, diffraction and scattering of the optical signals received and/or emitted by the pixels.

In the case of a device including diodes carrying out a light emission and/or a light reception from their front face (face opposite to that located on the side of the substrate on which the diodes are produced), such a collimation grid may be produced during the manufacture of the interconnection levels, also called BEOL (Back End Of Line), of the device. One of these interconnection levels, formed on the side of the front face of the diodes, may be dedicated to the production of the collimation grid. This configuration makes it possible to obtain a high degree of integration, and thus low bulk, as well as good alignment of the collimation grid with the pixels. However, this configuration is not applicable to a device carrying out light emission and/or reception from the rear face of the diodes because the interconnection levels are produced on the front face of the device. In addition, the height of the collimation grid thereby obtained is limited by the techniques implemented to produce the interconnection levels, this height generally being between around 1 µm and 3 µm.

In the case of a device carrying out light emission and/or reception from its rear face, the collimation grid is thus produced by a specific method implemented after the production of the interconnection levels, the transfer of the device onto a support and the removal of the substrate from which the device is produced. The removal of the substrate frees the rear face of the diodes on which the collimation grid is produced. The main problems to manage are in this case the alignment of the collimation grid with the pixels, and the production of the collimation grid with a high aspect ratio.

When the collimation grid is transferred simultaneously onto the rear faces of several emission and/or reception devices transferred onto a same support (transfer at the scale of the substrate, or "wafer level"), before the cutting of the support making the devices unitary, the alignment precision obtained may be less than around 1 µm. Conversely, the alignment must take account of a potential deformation of the devices which could appear after having removed the substrates from which the devices are produced. In addition, the steps implemented to produce the collimation grid may be subjected to constraints linked notably to the technique used to transfer the devices onto their support, such as for example a temperature not to exceed constraint or constraints regarding the chemicals that can be used without damaging the bonding interface between the devices and the support.

When the collimation grid is produced on a unitary light emission and/or reception device, for example of millimetric size, transferred onto a support corresponding for example to an active circuit of ASIC (Application Specific Integrated Circuit) type by means of electrical connections of, for example, micro-pillar or micro-bead type, it is difficult to obtain good alignment between the collimation grid and the pixels because microelectronic techniques can no longer be used for the production of the collimation grid. It is also difficult to produce the collimation grid with a high aspect ratio given the methods applicable at this scale and the topology of the device. Furthermore, the collimation grid cannot be produced on the device before its transfer onto the support because on the one hand it is necessary to make the device integral with the support before removing the substrate to retain good mechanical stability of the whole, and on the other hand the topology created by the collimation grid would make the transfer of the device onto its support very difficult.

To produce a collimation grid on a unitary light emission and/or reception device, it is possible to reconstitute a wafer from devices transferred beforehand onto their supports (for example diodes each assembled on a CMOS chip), in order to enable the use of microelectronic techniques capable of attaining the performances in alignment and resolution required for the production of the collimation grid. Such a method involves making the devices and their supports integral on a wafer, then producing a flat surface by immersing them in an encapsulation material without damaging the devices. The collimation grid is next produced by lithography on the rear faces of the devices. In this case, it is however necessary to take into account the misalignment of the devices linked to their individual transfer onto the wafer and to the method of reconstruction, this misalignment being able to be in the end several microns. Moreover, a collimation grid having a height of several microns and an aspect ratio greater than 2 requires a complicated lithography method necessitating very sophisticated equipment.

DESCRIPTION OF THE INVENTION

Thus there is a need to propose a solution to separate optically the adjacent pixels of a light emitting and/or light receiving device on the rear face while minimising the surface occupied on the device to manage this, offering good alignment between the pixels and the collimation grid used to achieve this optical separation, which is compatible with the production of a collimation grid having a high aspect ratio, for example greater than or equal to 2, and which can apply to unitary devices or to several devices arranged on a same support.

To do so, one embodiment proposes a method for producing at least one device with light emitting and/or light receiving diodes, comprising at least:
  producing, on a substrate, a stack of layers including at least first and second semiconductors layers doped according to opposite types of conductivity, the first layer being arranged between the substrate and the second layer;
  first etching of the stack from a front face of the stack located on the side opposite to that arranged against the substrate, forming first openings made through the entire thickness of the second layer and of which the bottom walls are formed by the first layer;
  producing dielectric portions covering, in the first openings, the side walls formed at least by the second layer;
  second etching of the stack, extending the first openings through a remaining thickness of the first layer until reaching the substrate, the first openings delimiting portions of the first and second layers forming the p-n junctions of the diodes;
  additional etching extending the first openings into a part of the substrate;
  producing first electrically conductive portions arranged in the first openings and in contact electrically with the side walls of the portions of the first layer, forming first electrodes of the diodes, and producing second electrodes electrically connected to the portions of the second layer;
  eliminating the substrate, exposing, or revealing, a rear face of the stack of layers forming an emissive face of each of the diodes and freeing the parts of the first electrically conductive portions forming a collimation grid.

With this method, the collimation grid and the first electrodes of the diodes are formed by the same elements (the first electrically conductive portions), using, for their production, the substrate from which the diodes are produced. Thus, the collimation grid is self-aligned with the first electrodes of the diodes, which limits optical losses within the device and eliminates problems of alignment of the collimation grid vis-à-vis the diodes encountered in methods of the prior art. This further makes it possible to reduce the dimensions of the dead zones within the device since no surface is lost due to a misalignment between the collimation grid and the pixels.

In this method, the elements forming the collimation grid are produced before the elimination of the substrate, which avoids problems linked to a potential deformation of the diodes which can appear after having removed the substrate, and eliminates the constraints linked to the technique used to transfer the devices onto their support given that the elements of the collimation grid are produced before the elimination of the substrate.

This method also has the advantage of making it possible to produce the collimation grid with very favourable geometry to obtain good optical insulation performances between the pixels and with low parasitic reflections between the pixels. The collimation grid may notably be produced such that the parts of the first electrically conductive portions forming this grid have an aspect ratio for example greater than 2, or advantageously greater than or equal to 4.

This method also offers great freedom concerning the geometry with which the elements of the collimation grid are produced, due to the fact that the shape of the parts of the first electrically conductive portions forming the collimation grid is defined by the shape of the first openings produced in the substrate, which can be easily adapted as a function of needs.

This method also has the advantage of being able to be implemented at the wafer level by microelectronic techniques with great precision, great robustness and great reproducibility, but also for unitary devices.

This method advantageously combines the production of the collimation grid with an efficient production of the electrodes of the diodes and contributing to the optimisation of the useful surface of the diodes.

Moreover, the collimation grid thereby produced does not have a discontinuity with the first electrodes of the diodes, which leads to better mechanical strength of the collimation grid on the diodes, lower cross-talk, and a reduction in parasitic reflections within the device.

The simultaneous production of the collimation grid and the first electrodes of the diodes also makes it possible to reduce the total number of steps to implement to produce the collimation grid and the first electrodes of the diodes.

This method applies to the production of a device of which the diodes carry out light emission and/or light reception from a rear face of the stack of layers (face located on the side of the substrate on which the stack of layers is arranged). The diodes may be electrically interconnected at their front faces.

When non-intentionally doped semiconductor is present between the first and second layers, the junctions of the diodes correspond to p-i-n junctions.

The part of the substrate in which the additional etching extending the first openings is implemented may have a thickness between 1 µm and 20 µm. This depth may correspond to the height of the collimation grid obtained. The final height of the collimation grid of the device may however be different from this depth if for example additional portions of electrically conductive material are formed on the first electrically conductive portions, for example after having eliminated the substrate, to increase the height of the collimation grid. Advantageously, the part of the substrate in which the additional etching extending the first openings is implemented may have a thickness greater than 3 μm in order to obtain a collimation grid of height greater than 3 μm.

A ratio between the thickness of the part of the substrate in which the additional etching extending the first openings is implemented and a smallest dimension of each first opening in a plane parallel to an interface between the substrate and the stack of layers (this smallest dimension corresponding to the width of the parts of the first electrically conductive portions forming the collimation grid), corresponding to the aspect ratio of parts of the first electrically conductive portions forming the collimation grid, may be greater than or equal to 2, or even advantageously greater than or equal to 4.

The first etching of the stack may be implemented such that the first openings are also made through a part of the first layer, and the dielectric portions may be produced such that they cover, in the first openings, the side walls of said part of the first layer. This configuration makes it possible to form a good electrical insulation between the first electrodes and the second semiconductor layer.

The method may be such that:
the stack comprises a dielectric mask forming the front face of the stack,
the first and second etchings of the stack are implemented through the dielectric mask such that the first openings are also made through the dielectric mask, and
the dielectric portions also cover, in the first openings, side walls of the dielectric mask.

This dielectric mask also contributes to achieving good electrical insulation between the first and second electrodes at the front faces of the diodes.

The second etching of the stack may be carried out such that the side walls of the dielectric portions are aligned with the side walls of the portions of the first layer.

The method may further comprise, between the second etching of the stack and the production of the first electrically conductive portions, the production of second openings through the dielectric mask and in which the second electrodes may be at least partially produced.

The first and second electrodes may be produced by depositing at least one electrically conductive material in the first and second openings and on the dielectric mask, then by implementing a step of planarization of the electrically conductive material with stoppage on the dielectric mask.

The stack may further comprise an electrically conductive layer such that the second layer is arranged between the electrically conductive layer and the first layer, and the first etching of the stack may be implemented such that the first openings are made through the electrically conductive layer and delimit portions of the electrically conductive layer forming a part of each of the second electrodes.

The method may further comprise, between the production of the first electrically conductive portions and the elimination of the substrate, the implementation of a transfer of the stack and the substrate onto a support such that the stack is arranged between the substrate and the support. In such a configuration, the front face of the stack is arranged facing the support.

The transfer of the stack and the substrate may be implemented with electrically conductive connection elements electrically connecting the first and second electrodes of the diodes to the support during the implementation of the transfer of the stack and the substrate onto the support.

The step of eliminating the substrate may be implemented collectively for several devices with light emitting and/or light receiving diodes each including a stack and a substrate transferred onto a support, and the supports of the devices with light emitting and/or light receiving diodes may be made integral on a maintaining wafer before the implementation of the step of eliminating the substrate.

The first openings may be made such that they form a grid pattern surrounding each of the diodes.

The etching steps may be implemented such that each of the first openings delimiting the p-n junctions of light emitting diodes has a smallest dimension, at the level of a bottom wall formed in the substrate, which is less than a smallest dimension of the first opening at the level of an interface between the substrate and the stack, and/or each of the first openings delimiting the p-n junctions of light receiving diodes has a smallest dimension, at the level of the bottom wall formed in the substrate, which is greater than the smallest dimension of the first opening at the level of the interface between the substrate and the stack. Such configurations are favourable to improving the directivity of emission of light emitting diodes and to reducing cross-talk between light receiving diodes.

The method may further comprise, after the step of eliminating the substrate, the implementation of a step of depositing at least one antireflective and/or metal layer on the collimation grid, and/or the implementation of a treatment increasing the roughness of the collimation grid. Such steps may improve the optical qualities of the collimation grid.

BRIEF DESCRIPTION OF THE DRAWINGS

The present invention will be better understood on reading the description of exemplary embodiments given for purely indicative purposes and in no way limiting while referring to the appended drawings in which.

Identical, similar or equivalent parts of the different figures described hereafter bear the same numerical references so as to make it easier to go from one figure to the other.

The different parts shown in the figures are not necessarily shown according to a uniform scale, in order to make the figures more legible.

The different possibilities (alternatives and embodiments) must be understood as not being mutually exclusive and may be combined together.

DETAILED DESCRIPTION OF PARTICULAR EMBODIMENTS

FIGS. 1A to 1J show the steps of a method for producing a device 100 with light emitting and/or light receiving diodes according to a particular embodiment. In this embodiment, the device 100 comprises several diodes 102 forming at least one matrix of diodes and serving as matrix or matrices of pixels of the device 100. In an alternative, the diodes 102 may be produced next to each other without forming a matrix of diodes, that is to say without regular spacing between them. Moreover, in the particular embodiment described below, the diodes 102 correspond to light emitting diodes, here LEDs.

Figure 1A:
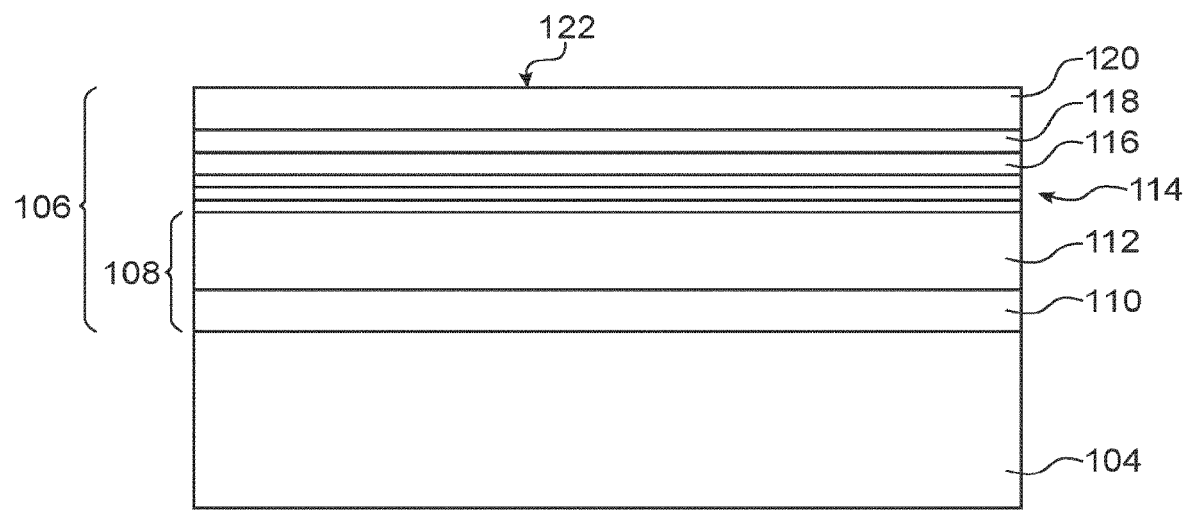
FIGS. 1A to 1J show the steps of a method for producing a device with light emitting and/or light receiving diodes according to a particular embodiment.

As shown in FIG. 1A, the device 100 is produced from a substrate 104 including for example sapphire and/or silicon and/or a semiconductor for example similar to that used to form the active part of the diodes 102, and/or carbon silicide and/or glass and/or any other material enabling the substrate 104 to form a growth substrate enabling the production of the semiconductor stack forming the active part of the diodes 102. The substrate 104 serves as support for the deposition and/or the growth of the layers intended for the production of the diodes 102 of the device 100.

A stack 106 of layers is formed on the substrate 104. This stack 106 comprises materials from which the diodes 102 are going to be produced.

The stack 106 comprises a first semiconductor layer 108 doped according to a first type of conductivity, for example of n type, deposited on the substrate 104. In the particular embodiment described here, this first layer 108 corresponds to a superimposition of several distinct semiconductor layers, for example a n+ doped semiconductor layer 110 with a concentration of donors for example between around $5.10^{17}$ and $5.10^{20}$ donors/cm$^3$ on which is arranged another n– doped semiconductor layer 112 with a concentration of donors for example between around $10^{17}$ and $5.10^{19}$ donors/cm$^3$. For example, the layer 110 comprises GaN and the layer 112 comprises InGaN. The thickness of the layer 110 is for example greater than around 100 nm, and here equal to around 3 μm, and that of the layer 112 is for example between around 5 nm and 500 nm. The total thickness of the first layer 108, that is to say the sum of the thicknesses of layers 110 and 112 in the example described here, is for example between around 20 nm and 10 μm, and preferably between around 2 μm and 4 μm. The layer 110 here forms a buffer layer arranged between the layer 112 and the substrate 104 and serves notably to filter growth defects of the layer 112 in order that these defects are not found again in the layer 112.

In an alternative, the layers 110 and 112 may be doped with a same n type doping level (unlike the case described above where the layer 110 is n+ doped and the layer 112 is n– doped).

According to another alternative, the first layer 108 may correspond to a single layer of n doped semiconductor, and with a concentration of donors for example between around $10^{17}$ and $5.10^{20}$ donors/cm$^3$, comprising for example GaN and of which the thickness is for example between around 20 nm and 10 μm, and advantageously between around 2 μm and 4 μm.

The stack 106 also comprises one or more emissive layer(s) 114, for example five emissive layers 114, each intended to form, in the diodes 102, a quantum well. In FIG. 1A, only three emissive layers 114 are shown. The emissive layers 114 comprise for example InGaN. Each of the emissive layers 114 is arranged between two barrier layers (not visible in FIGS. 1A-1J), including for example GaN. The emissive layers 114 are arranged on the first layer 108. The emissive layers 114 comprise so-called intrinsic semiconductor materials, that is to say not intentionally doped (of concentration of residual donors $n_{nid}$ for example equal to around $10^{17}$ donors/cm$^3$, or between around $10^{15}$ and $10^{18}$ donors/cm$^3$). The thickness of each of the emissive layers 114 is for example equal to around 3 nm and more generally between around 0.5 nm and 10 nm, and the thickness of each of the barrier layers is for example between around 1 nm and 25 nm.

The stack 106 also comprises a second semiconductor layer 116 doped according to a second type of conductivity, opposite to that of the doping of the first layer 108 and thus here of p type, with a concentration of acceptors for example between around $10^{17}$ and $5.10^{19}$ acceptors/cm$^3$. The second layer 116 is arranged on the emissive layers 114. The first and second layers 108 and 116 (and more particularly layers 112 and 116 in the example described here) are intended to form the p-n junctions of the diodes 102. The semiconductor of the second layer 116 is for example GaN and its thickness is for example between around 20 nm and 10 μm.

In an alternative embodiment, an electron blocking layer (not visible in FIG. 1A) may be arranged between the second layer 116 and the emissive layers 114, this electron blocking layer including for example AlGaN with for example around 12% of aluminium and p doped with a concentration of acceptors for example equal to around $1.10^{17}$ acceptors/cm$^3$.

Materials other than those cited above may be used to produce the diodes 102.

The stack 106 also comprises an electrically conductive layer 118 intended to form, in each of the diodes 102, a part of a second electrode (corresponding to the anode in the example described here) which will be in contact with the semiconductor of the second layer 116. The electrically conductive layer 118 is arranged on the second layer 116. The electrically conductive material used is for example optically reflective, and corresponds for example to aluminium.

Finally, the stack 106 also comprises a layer 120 intended to form a hard dielectric mask, arranged on the electrically conductive layer 118. The material of this layer 120 is for example $SiO_2$. The upper face of the layer 120 here forms a front face 122 of the stack 106, this front face 122 being located on the side opposite to that arranged against the substrate 104.

A first etching of the stack 106 is implemented from the front face 122 of the stack 106 to form, in the stack 106, first openings 124 which will next be used to produce the first electrodes (corresponding to the cathodes in the example described here) of the diodes 102 as well as the collimation grid of the device 100.

This first etching is firstly carried out in the layer 120 to form a dielectric mask 126 that will serve as etching mask for the etching of the other layers of the stack 106. The pattern formed by the first openings 124 in the dielectric mask 126 corresponds to that of the first electrodes of the diodes 102 and the collimation grid. The first openings 124 are also intended to delimit portions of the first and second layers 108 and 116 forming the p-n junctions of the diodes 102. In the exemplary embodiment described here, the diodes 102 are produced in the form of mesa structures, or islet structures. In addition, in the embodiment described here, the cathodes of the diodes 102 form a cathode common to several diodes 102, or to all the diodes 102, of the device 100.

An etching of the electrically conductive layer 118 is next implemented according to the pattern of the dielectric mask 126. Remaining portions 128 of the layer 118 are intended to form the parts of the second electrodes of the diodes 102.

Figure 1B:
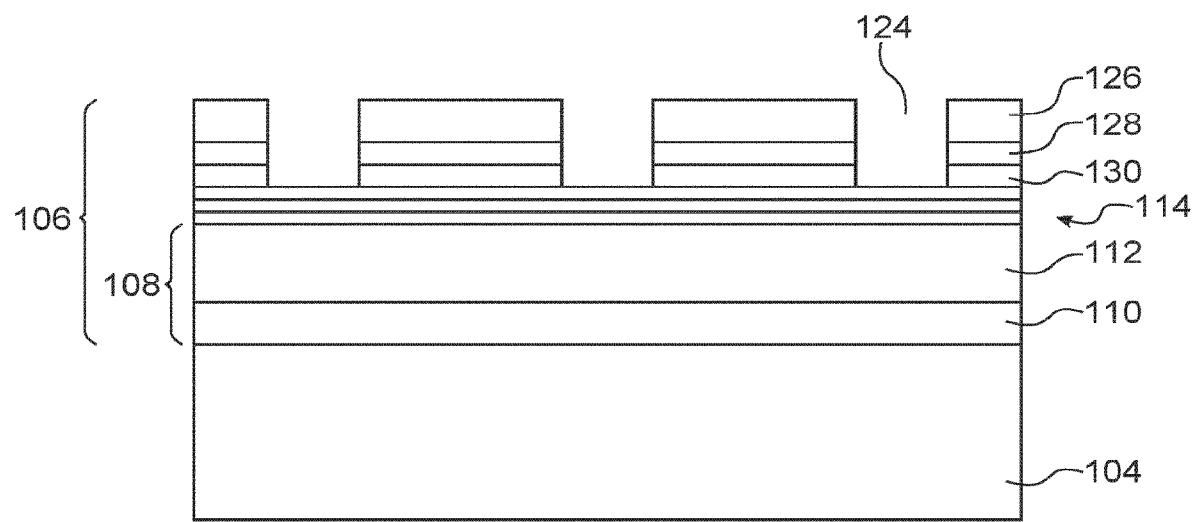

An etching of the second layer 116 is next implemented according to the pattern of the dielectric mask 126, forming doped semiconductor portions 130 intended to form part of the p-n junctions of the diodes 102 (see FIG. 1B). The layers 116, 118 and 120 are for example etched by the implementation of a reactive ion etching by a plasma torch system, or ICP-RIE (Inductively Coupled Plasma—Reactive Ion Etching).

Figure 1C:
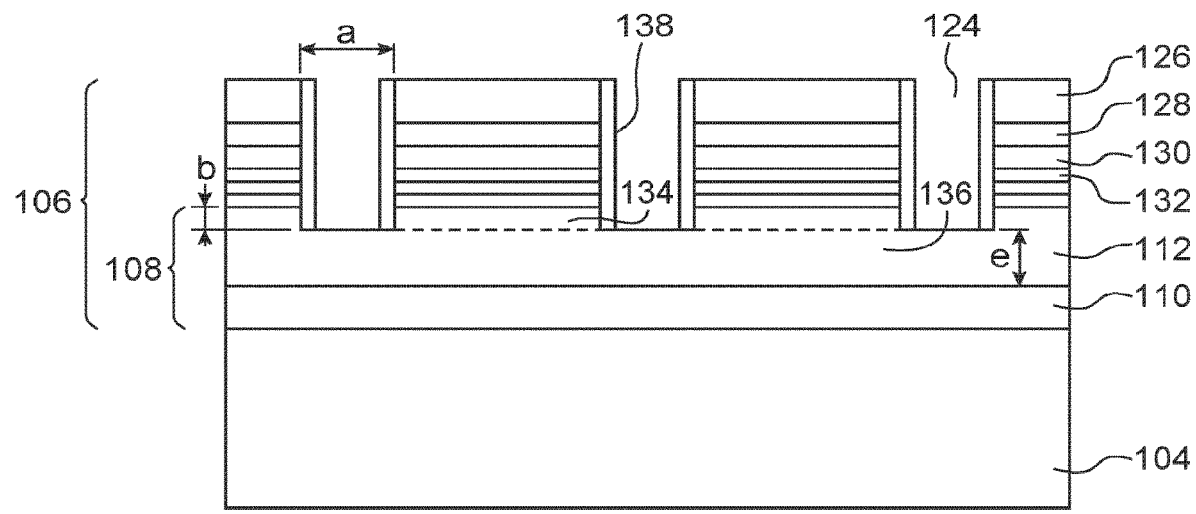

As shown in FIG. 1C, the first openings 124 are extended by etching into the emissive layers 114 and into a part of the thickness of the first layer 108, still according to the pattern defined by the dielectric mask 126. This etching is stopped at a depth level located in the first layer 108 and such that the bottom walls of the first openings 124 are formed by the first layer 108. In the example described here, the etching is stopped at a level located in the layer 112 such that the layer 110 and a part of the thickness of the layer 112 are not etched. The thickness, referenced "b" in FIG. 1C, of the layer 112 which is etched is for example between around 100 nm and 5 µm. The remaining thickness of the layer 112 noted "e" thus results from the choice of the initial thicknesses of the layers 110 and 112 and the depth of the etching in the layer 112. The choice of the depth of etching carried out, and thus of the remaining thickness of the first layer 108 in the bottom of the first openings 124, depends notably on the initial thickness of the first layer 108 (and thus on the initial thicknesses of the layers 110 and 112 in the embodiment described here) and does so in order that the remaining thickness of the first layer 108 is sufficient to achieve good electrical contact between the semiconductor(s) of the first layer 108 and the first electrodes of the diodes 102 that will be produced later in the first openings 124.

In an alternative, this etching may be stopped at the level of the upper face of the layer 110 such that this layer 110 is not etched but that the entire thickness of the layer 112 is etched. According to another alternative, this etching may be stopped at a level located in the layer 110 such that, in the first layer 108, only a part of the thickness of the layer 110 is not etched. These two alternatives may be envisaged when the material of the layer 110 is suited for forming, with the material of the layer 116, the p-n junctions of the diodes 102.

The remaining portions of the emissive layer(s) 114 form the active zones 132 of the diodes 102. This first etching also forms the parts 134 of doped semiconductor portions 136 intended to form, with the portions 130, the p-n junctions (p-i-n junctions in the example described here, on account of the presence of the emissive layers 114 between the first and second layers 108, 116) of the diodes 102 (in FIG. 1C, the parts 134 are delimited symbolically from the remainder of the portions 136 by the dashed lines).

A dimension, referenced "a" in FIG. 1C, of the first openings 124 corresponding to the distance between two mesa structures of neighbouring diodes 102 is for example greater than or equal to around 50 nm, the minimum distance between two neighbouring diodes 102 being defined by the minimum resolution of the lithography implemented. This dimension "a" corresponds to the sum of the width of a portion of electrically conductive material that will be produced between the two mesa structures of the diodes 102 to form a cathode common to these diodes 102 and the thicknesses of two vertical dielectric portions that will also be arranged between the two mesa structures of the diodes 102. Thus, the dimension "a" is a function of the width of the cathode produced between the diodes 102, which is chosen notably as a function of the acceptable losses linked to the supply of the electric current in the zones the furthest away from the peripheral contacts. The etching implemented is a dry etching, for example by a $Cl_2$ based plasma or an RIE etching, for example ICP-RIE.

The dimensions of the sides of one of the mesa structures may be between around 500 nm and 1 mm, or between 500 nm and several millimetres, according to the targeted applications. For applications resorting to high power diodes (for example LED bulbs forming car headlights), the dimensions of the diodes 102 will be greater than for applications resorting to low power diodes 102.

A dielectric layer, corresponding for example to a SiN/$SiO_2$ bilayer, and forming a passivation layer, is next deposited with a conformal thickness, for example between around 5 nm and 1 µm and advantageously equal to around 200 nm, on the dielectric mask 126 and along the walls of the first openings 124, thus covering the side walls of the dielectric mask 126, electrically conductive portions 128, semiconductor portions 130, active zones 132 and the parts 134 of the portions 136. The dielectric layer is also deposited on the non-etched parts of the first layer 108 forming the bottom walls of the first openings 124. This dielectric layer is for example formed by PECVD (plasma enhanced chemical vapour deposition) or ALD (atomic layer deposition) type deposition, depending on the nature of the material(s) deposited.

An anisotropic etching, for example a dry etching such as an RIE etching, is next implemented such that the parts of the dielectric layer located in the first openings 124 and not covering the side walls of the mesa structures of the diodes 102 are removed, thereby exposing the parts of the first layer 108 found at the bottom of the first openings 124. The parts of this dielectric layer covering the upper face of the dielectric mask 126 are also removed. Thus, only the portions 138 of the dielectric layer covering the side walls of the dielectric mask 126, the electrically conductive portions 128, the semiconductor portions 130, the active zones 132 and the parts 134 of the semiconductor portions 136 are maintained in the first openings 124.

Figure 1D:
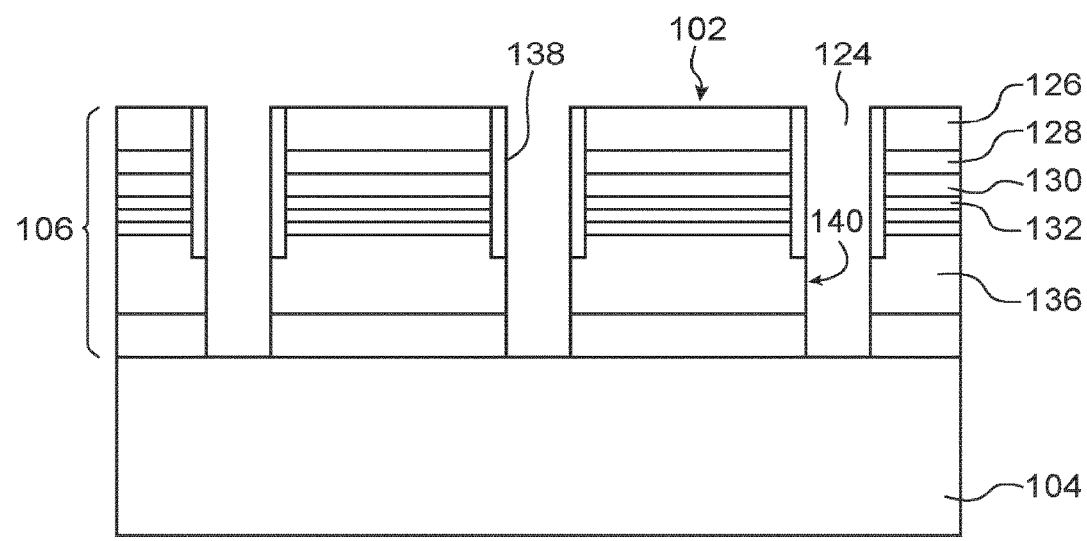

As shown in FIG. 1D, a second etching of the stack 106 is implemented, extending the first openings 124 through the remaining thickness of the first semiconductor layer 108 until reaching the substrate 104, that is to say until the bottom walls of the first openings 124 are formed by the substrate 104. This second etching makes it possible to delimit the semiconductor portions 136 between each other and completes the formation of the mesa structures of the diodes 102. This second etching makes it possible to expose the side walls 140 of the portions 136 that are going to form electrical contact zones for the first electrodes of the diodes 102.

At the end of this second etching, the dielectric mask portions 126, the electrically conductive portions 128, the semiconductor portions 130 and 136, the active zones 132 and the dielectric portions 138 form mesa structures, that is to say stacks in the form of islets, arranged on the substrate 104. Each mesa structure of each diode 102 has a section, in a plane parallel to the face of the substrate 104 on which these structures rest, for example disk shaped. Each of the mesa structures can thus form an islet of cylindrical shape. Mesa structures of different shape may be envisaged, for example paving shaped.

Figure 1E:
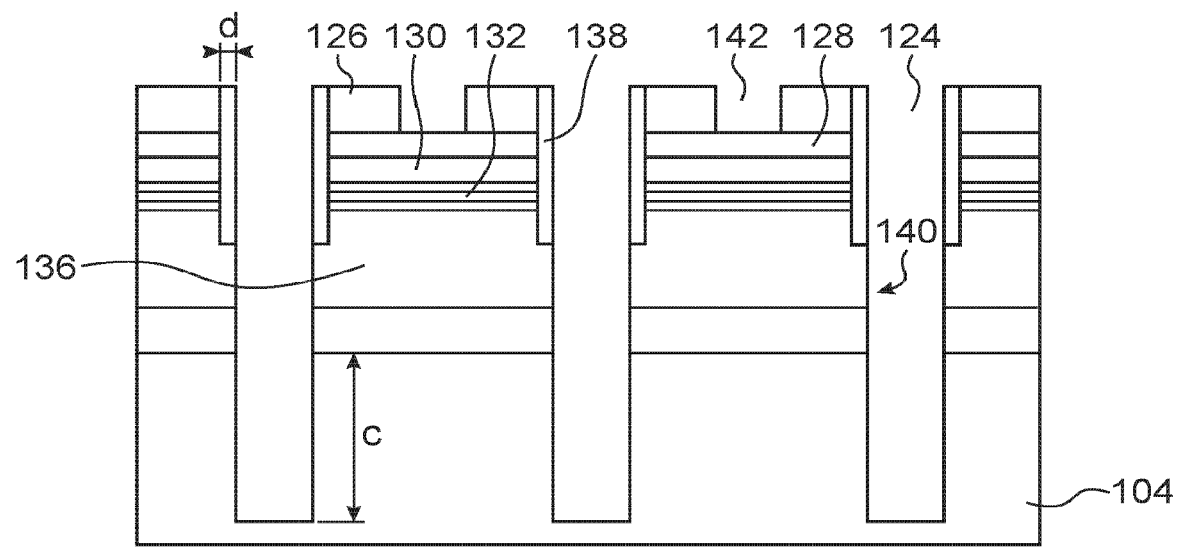

Another additional step of anisotropic etching, for example of RIE or DRIE type and selective vis-à-vis the materials of the diodes 102 other than that or those of the substrate 104, is implemented to extend the first openings 124 through a part of the thickness of the substrate 104, called "c" in FIG. 1E.

First electrically conductive portions are intended to be produced in the first openings 124 to form the first electrodes of the diodes 102 as well as the collimation grid of the device 100. The depth "c" of the parts of the first openings 124 in the substrate 104 correspond to the height of the collimation grid that will be obtained at the end of the method. The value of this depth "c" thus depends on the type of diodes 102 and the desired separation and/or focusing performances. For example, when the diodes 102 correspond to LEDs, the depth "c" is for example between around 1 µm and 20 µm, and advantageously greater than or equal to around 10 µm.

For example, for pixels having sides of dimension equal to 40 μm, the depth "c" is for example equal to 10 μm.

By considering that the thickness of each of the portions 138 is called "d", the width, or more generally the lateral dimension, of each of the first openings 124 in the substrate 104 is equal to "a-2d". The dimensions a, c and d are thus chosen such that the aspect ratio (height/width) of the first openings 124 is advantageously greater than or equal to 2, or even greater than or equal to 4.

Second openings 142 are next produced through the dielectric mask 126, forming emplacements for the production of the second electrodes of the diodes 102 (FIG. 1E). These second openings 142 are made through the entire thickness of the dielectric mask 126 in order that the bottom walls of the second openings 142 are formed by the electrically conductive portions 128. This etching is for example of ICP-RIE type.

Figure 1F:
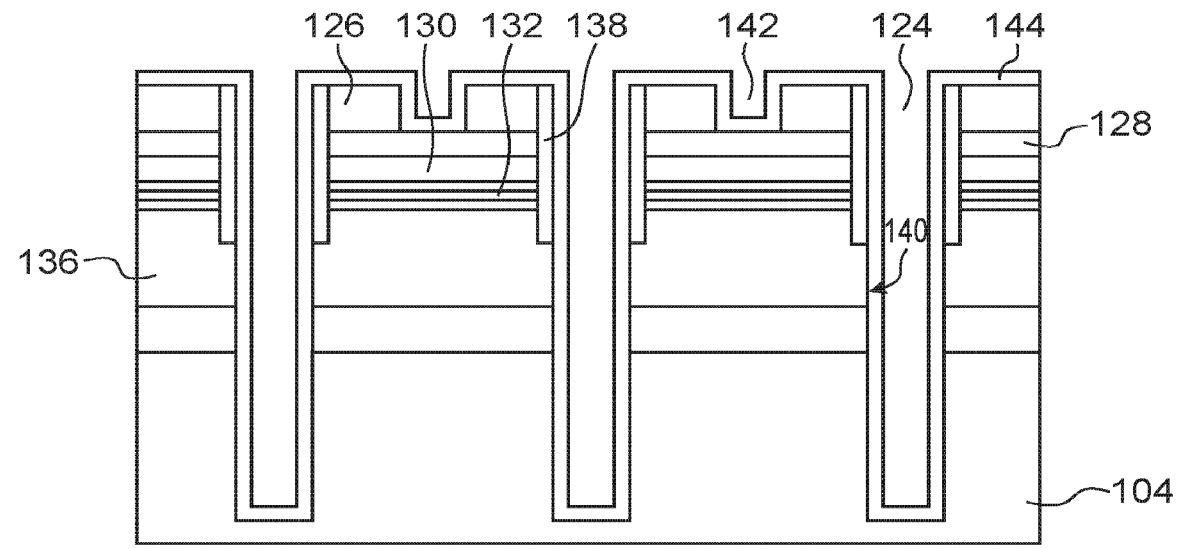

A first electrically conductive material 144 is next deposited in the first and second openings 124, 142 as well as on the dielectric mask 126 (FIG. 1F). This first electrically conductive material 144 is deposited conformally, that is to say forming a layer of substantially constant thickness on the dielectric mask 126 and along the side walls and bottom walls of the first and second openings 124, 142. In the exemplary embodiment described here, the first electrically conductive material 144 is formed by the deposition, for example of PVD type, of a first titanium layer of thickness for example between around 5 nm and 300 nm, followed by a deposition, for example PVD, of a second aluminium layer of thickness for example between around 50 nm and 1 μm. The deposition techniques implemented are chosen to that they are suited to the high aspect ratio of the volumes formed by the first openings 124, and correspond for example to those implemented to deposit the electrically conductive material(s) of the conductive vias or TSVs (Through Silicon Vias).

The first electrically conductive material 144 is in contact electrically with the side walls 140 of the semiconductor portions 136 in the first openings 124, and with the portions 128 at the bottom walls of the second openings 142.

Figure 1G:
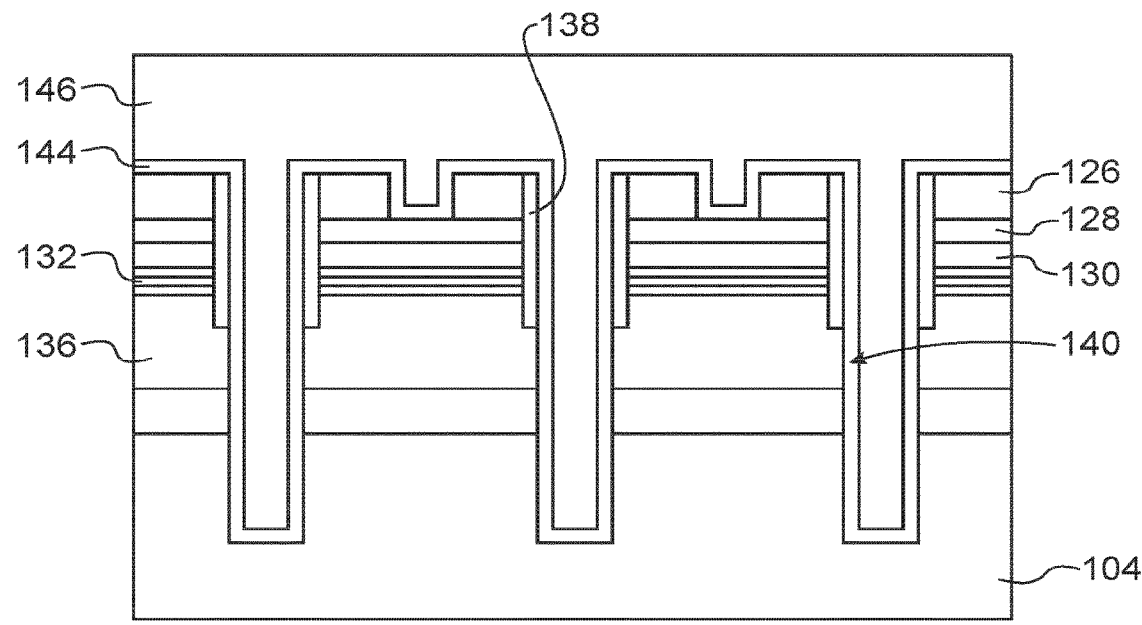

As shown in FIG. 1G, a second electrically conductive material 146 is deposited while filling the remaining volumes of the first and second openings 124, 142. In FIG. 1G, the thickness of this second electrically conductive material 146 is such that it also covers the parts of the first electrically conductive material 144 arranged on the dielectric mask 126. The second electrically conductive material 146 is for example copper which may be formed by the implementation of a full wafer electrochemical deposition (ECD), that is to say on the whole of the structure produced previously.

Figure 1H:
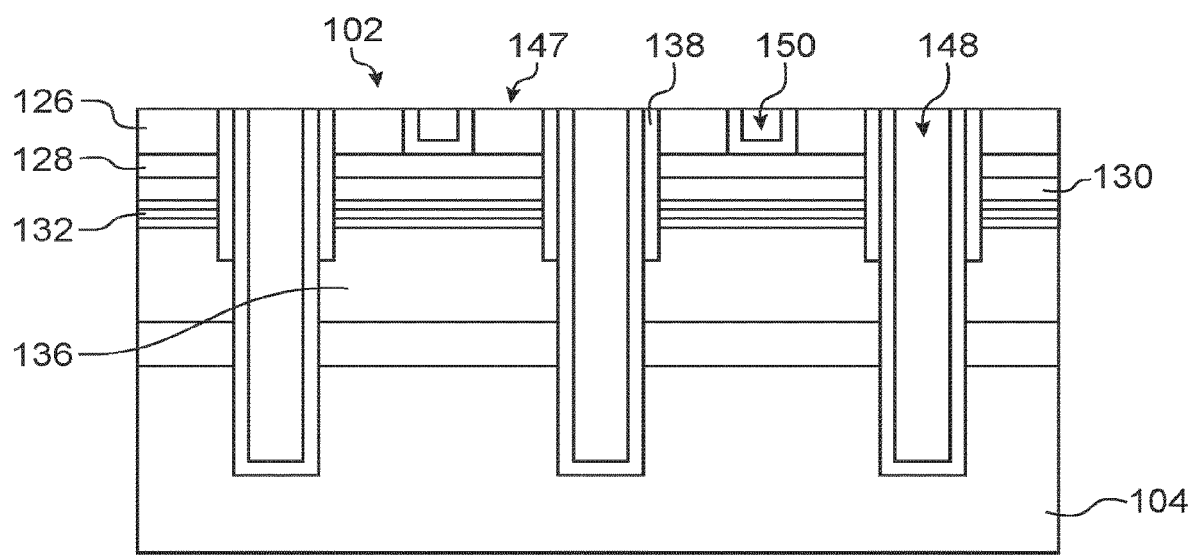

The diodes 102 of the future device 100 are completed by implementing a chemical mechanical planarization (CMP) in order to eliminate the portions of the first and second electrically conductive materials 144 and 146 that extend from the first and second openings 124, 142 (see FIG. 1H). This planarization makes it possible to electrically insulate the electrically conductive materials present in the first openings 124 vis-à-vis those arranged in the second openings 142.

The electrically conductive materials present in the first openings 124 form first electrically conductive portions 148 extending over the whole height of the mesa structures of the diodes 102, which are electrically connected to the semiconductor portions 136 uniquely at the side walls 140, and which extends into the substrate 104. The parts of these first electrically conductive portions 148 located at the mesa structures of the diodes 102 form the first electrodes of the diodes 102, and the parts of these first electrically conductive portions 148 located in the layer 108 and in the substrate 104 are intended to form the collimation grid of the future device 100.

The electrically conductive materials located in the second openings 142 form second electrically conductive portions 150 corresponding to the second electrodes of the diodes 102, each in contact electrically with one of the semiconductor portions 130 through one of the electrically conductive portions 128.

The structure obtained comprises an upper face 147 which is substantially flat, formed by the upper faces of the first and second electrically conductive portions 148, 150, the dielectric portions 138 and the dielectric mask 126. This face 147 corresponds to the front face of the diodes 102 at which electrical connections with the electrodes will be produced.

Thanks to the vertical dielectric portions 138, the first electrically conductive portions 148 are electrically insulated from the semiconductor portions 130 and the active zones 132. The thickness "d" of the dielectric portions 138 may be chosen such that an acceptable leakage current is tolerated on each of the diodes 102, for example less than around 1% of the nominal current which crosses the diode 102, when they are subjected to a potential difference (applied between the cathode and the anode) for example of the order of 4 Volts. The minimum thickness of the dielectric portions 138 is for example between around 3 nm and 5 nm, or between 3 nm and 4 nm, as a function of the material(s) used to produce the dielectric portions 138.

In order to guarantee an electrical insulation between the first and second electrodes of the diodes 102, and to avoid the presence of electrically conductive materials 144 and 146 on the face 147 which could create a short-circuit between two electrodes, the planarization step is advantageously implemented until an over-etching of the first and second electrically conductive portions 148, 150 compared to the dielectric materials of the portions 138 and the dielectric mask 126, forming in the first and second electrically conductive portions 148, 150 hollows at the upper faces of these portions. These hollows may have a depth, with respect to the plane of the upper face 147, between around 5 nm and 150 nm. This over-etching may be obtained by tuning the etching anisotropy and thanks to the etching selectivity that exists between the dielectric materials of the portions 138 and the mask 126 and the materials of the electrically conductive portions 148, 150. The CMP implemented has a different abrasion speed according to the materials and, in the method described here, the abrasion of the materials of the electrically conductive portions 148, 150 is faster than that of the dielectric materials of the portions 138 and the mask 126. This results in, at the upper face 147, a removal of the materials of the electrically conductive portions 148, 150 with respect to the dielectric portions 138 and to the dielectric mask 126. Thus, the electrodes of the diodes 102 remain perfectly insulated from each other thanks to an intrinsic property of the planarization implemented. Such an over-etching may also be implemented by an RIE etching method.

In the embodiment described above, the semiconductor portions 136 are of n type and the semiconductor portions 130 are of p type. In an alternative, the semiconductor portions 136 may be of p type and the semiconductor portions 130 may be of n type. In this alternative, the first electrically conductive portions 148 form the anodes of the diodes 102 and the second electrically conductive portions 150 form, with the conducting portions 128, the cathodes of the diodes 102.

The substantially flat surface obtained at the upper face 147 makes it possible to hybridise easily the matrix of diodes 102 made with any type of support such as an electronic circuit. For example, it is possible to carry out a hybridisation between the matrix of diodes 102 and a support corresponding to an electronic circuit by direct bonding (also called bonding by molecular adhesion) of the matrix of diodes 102 to the electronic circuit, or by resorting to electrical connection elements between the matrix of diodes 102 and the electronic circuit. Details of the implementation of direct bonding are for example described in the document "Mechanisms of copper direct bonding observed by in-situ and quantitative transmission electron microscopy" of M. Martinez et al., Thin Solid Films 530 (2013) 96-99.

Figure 1I:
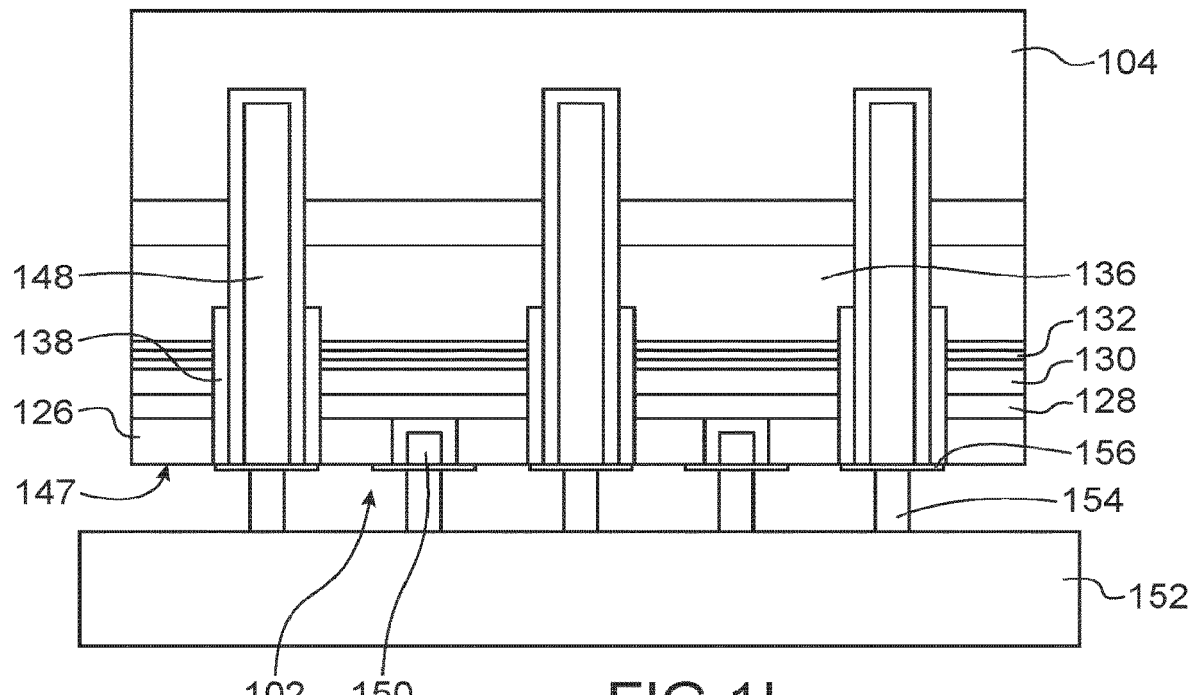

In the non-limiting exemplary embodiment shown in FIG. 1I, the matrix of diodes 102 is transferred onto a support 152 comprising electrical connection elements 154 to which the first and second electrodes of the diodes 102 are electrically connected. The face 147 of the matrix of diodes 102, corresponding to the front faces of the diodes 102, is arranged facing the support 152. The electrical connection elements 154 correspond for example to beads made of fusible alloy (including for example SnAg and/or indium), or copper pillars covered with a soldering material, or with micro-inserts, or micro-tubes.

This support 152 may correspond to an electronic circuit, including for example CMOS electronic components, onto which the matrix of diodes 102 is transferred and to which the matrix of diodes 102 is electrically connected. Such an electronic circuit may notably serve to electrically control the diodes 102 corresponding for example to light emitting diodes and/or to process the signals outputted by the diodes 102 corresponding for example to photodiodes. In an alternative, the support 152 may correspond to a passive element not comprising electronic components, such as for example a card or an organic substrate.

In the exemplary embodiment shown in FIG. 1I, connection pads 156 of UBM (Under Bump Metallization) type are produced on the face 147, against the first and second electrodes of the diodes 102, before the transfer of the diodes onto the support 152. The connection pads 156 ensure good electrical contact between the first and second electrodes of the diodes 102 and the electrical connection elements 154.

During the transfer of the matrix of diodes 102 onto the support 154, the presence of the substrate 104 makes it possible to ensure sufficient mechanical rigidity for handling and for making the matrix of diodes 102 integral with the support 154.

After this transfer, the substrate 104 is eliminated, thereby freeing the rear faces 158 of the diodes through which light is intended to enter or exit depending on whether the diodes 102 are light emitting or light receiving diodes. The techniques for removing the substrate 104 that are implemented must take into account the presence of the parts of the first electrically conductive portions 148 located in the substrate 104 and which are intended to form the collimation grid. Thus, the removal method implemented is selective with respect to the material(s) of the first electrically conductive portions 148 present in the substrate 104. For example, it is possible to remove firstly a part of the thickness of the substrate 104, in which the first electrically conductive portions 148 do not extend, by the implementation of a non-selective method, for example by honing, then to remove the remaining portions of the substrate 104 in a selective manner, for example by chemical or physical etching. It is also possible to remove the substrate 104 by laser lift-off. When the substrate 104 comprises sapphire, said substrate 104 may be eliminated by RIE plasma etching. The technique(s) implemented to eliminate the substrate 104 are adapted as a function of the material of the substrate 104.

Figure 1J:
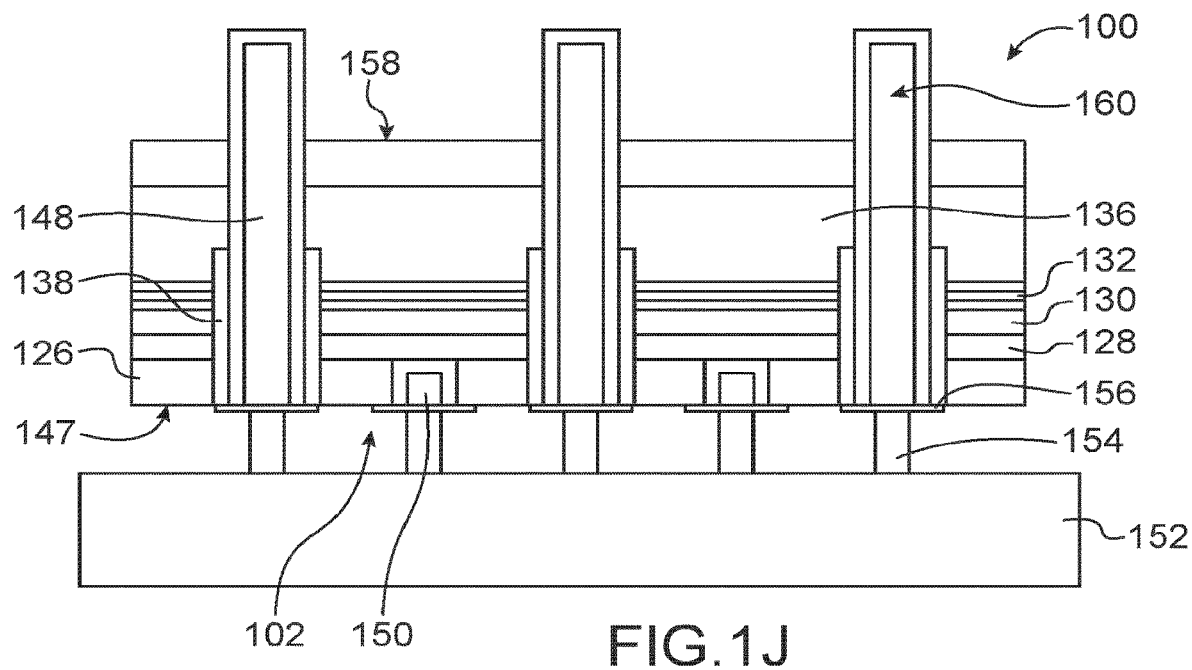

The structure obtained after eliminating the substrate 104 is shown in FIG. 1J. The parts of the first electrically conductive portions 148 freed from the substrate 104 form at least in part the collimation grid 160 of the device 100.

Optionally, after having eliminated the substrate 104, it is possible to deposit one or more layers of material(s) on the collimation grid 160 and/or to carry out one or more surface treatments of the collimation grid 160. For example, it is possible to implement a treatment aiming to improve the performances of the collimation grid 160. This treatment may comprise the deposition of a metal material on the collimation grid 160, improving the optical qualities of the collimation grid 160 such as for example the antireflection properties of the collimation grid 160. This treatment (for example an etching) may also increase the roughness of the collimation grid 160. This treatment may be selective or not vis-à-vis the rear faces 158 of the diodes 102.

In the particular embodiment described above, the device 100 advantageously comprises a matrix of diodes 102 which are light emitting diodes, the microelectronic device being able to form part of a display device with LEDs (screens, projectors, image walls, etc.). This matrix of diodes 102 comprises the first electrically conductive portions 148 which form a cathode common to all the diodes 102, and each diode 102 comprises a second electrically conductive portion 150 forming an anode making it possible to carry out the individual addressing of each of the diodes 102.

In an alternative, the microelectronic device 100 may comprise a matrix of diodes 102 which are light receiving diodes, or photodiodes. In this alternative, the anodes and the cathodes of the diodes 102 do not serve to supply current to the diodes 102 but serve to recover the currents photogenerated by the diodes 102.

According to another alternative, whether the diodes 102 correspond to light emitting diodes or to photodiodes, the mesa structures of the diodes 102 may not comprise layers between the doped semiconductor portions 130 and 136 (corresponding to the emissive active zones or to intrinsic semiconductor portions), and the p and n doped semiconductors are then arranged directly one against the other.

In the particular embodiment described previously, the first electrically conductive portions 148 are produced such that the parts forming the collimation grid 160 comprise side walls substantially perpendicular to the rear faces 158 of the diodes 102. In an alternative, it is possible that the angles formed between these side walls and the rear faces 158 of the diodes 102 are not equal to 90°.

For example, when the diodes 102 correspond to light emitting diodes, the first openings 124 may be produced such that their width, at the level of their bottom walls localised in the substrate 104, is less than their width at the level of an interface between the substrate 104 and the stack of layers forming the p-n junctions of the diodes 102. This profile of the first openings 124 is thus located on the parts of the first electrically conductive portions 148 forming the collimation grid 160. This particular profile of the collimation grid 160 is advantageous when the diodes 102 correspond to light emitting diodes because such a collimation grid makes it possible to reduce parasitic reflections of the light emitted by the diodes 102.

When the diodes 102 correspond to light receiving diodes, the collimation grid 160 may be produced with a profile inverse to that described above, that is to say such that the width of the first electrically conductive portions 148, at the level of the bottom walls localised in the substrate 104, is greater than their width at the level of the interface between the substrate 104 and the stack of layers forming the p-n junctions of the diodes 102. This particular profile of the collimation grid 160 is advantageous when the diodes 102 correspond to photodiodes because such a collimation grid 160 makes it possible to reduce the cross-talk effect between the diodes 102.

According to an alternative embodiment, after having eliminated the substrate 104, it is possible to partially etch the layer 110, over a part of its thickness, in order to increase the height of the parts of the first electrically conductive portions 148 forming the collimation grid 160.

Figure 2:
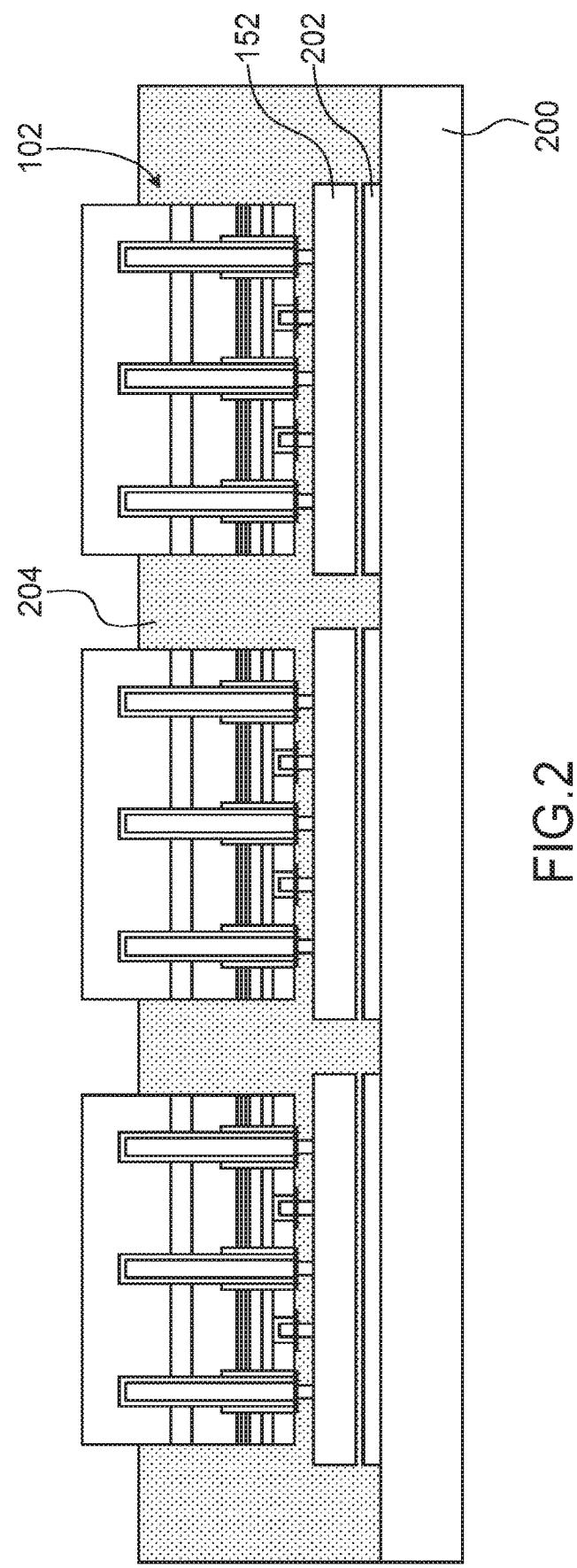
FIG. 2 shows an intermediate structure obtained during the implementation of a method for producing a device with light emitting and/or light receiving diodes according to an alternative embodiment.

According to an alternative embodiment, the step of eliminating the substrate 104 and optionally the partial etching of the layer 110 may be implemented collectively for several devices 100. As shown in FIG. 2, several future devices 100 each including the diodes 102 transferred onto the support 152 but still including the substrate 104 are transferred onto a maintaining wafer 200, and are for example maintained to this wafer through a temporary adhesive layer 202. In the example shown in FIG. 2, the future devices 100 are protected by an encapsulating material 204, including for example a polymer, formed around the devices 100 but not covering the substrates 104 of the future devices 100 in order that these substrates 104 are accessible. The substrates 104 of the future devices 100 may next be removed by implementing the techniques described previously, and this may be done without risk of damaging the diodes 102 thanks to the presence of the encapsulating material 204. After having removed the substrates 104, the encapsulating material 204 is removed, for example by dissolution, and the devices 100 are lifted off from the maintaining plate 200. In an alternative, a step of treatment of the collimation grids 160 of the devices 100 may be implemented collectively before removing the encapsulating material 204.

The invention claimed is:

1. A method for producing at least one device with at least light emitting diodes or light receiving diodes, comprising at least:
    producing, on a substrate, a stack of layers including at least first and second semiconductor layers doped according to opposite types of conductivity, the first layer being arranged between the substrate and the second layer;
    first etching of the stack from a front face of the stack located on the side opposite to that arranged against the substrate, forming first openings made through the entire thickness of the second layer and of which the bottom walls are formed by the first layer;
    producing dielectric portions covering, in the first openings, side walls formed at least by the second layer;
    second etching of the stack, extending the first openings through a remaining thickness of the first layer until reaching the substrate, the first openings delimiting portions of the first and second layers forming the p-n junctions of the diodes;
    additional etching extending the first openings into a part of the substrate;
    producing first electrically conductive portions arranged in the first openings and in contact electrically with the side walls of the portions of the first layer, forming first electrodes of the diodes, and producing second electrodes electrically connected to the portions of the second layer;
    eliminating the substrate, exposing a rear face of each of the diodes and freeing parts of the first electrically conductive portions forming a collimation grid.

2. The method according to claim 1, in which the part of the substrate in which the additional etching extending the first openings is implemented has a thickness between 1 μm and 20 μm and/or in which a ratio between the thickness of the part of the substrate in which the additional etching extending the first openings is implemented and a smallest dimension of each first opening in a plane parallel to an interface between the substrate and the stack is greater than or equal to 2.

3. The method according to claim 1, in which:
    the first etching of the stack is implemented such that the first openings are also made through a part of the first layer, and
    the dielectric portions are produced such that they cover, in the first openings, the side walls of said part of the first layer.

4. The method according to claim 1, in which:
    the stack comprises a dielectric mask forming the front face of the stack,
    the first and second etchings of the stack are implemented through the dielectric mask such that the first openings are also made through the dielectric mask, and
    the dielectric portions also cover, in the first openings, the side walls of the dielectric mask.

5. The method according to claim 4, in which the second etching of the stack is carried out such that the side walls of the dielectric portions are aligned with the side walls of the portions of the first layer.

6. The method according to claim 4, further comprising, between the second etching of the stack and the production of the first electrically conductive portions, the production of second openings through the dielectric mask and in which the second electrodes are at least partially produced.

7. The method according to claim 6, in which the first and second electrodes are produced by depositing at least one electrically conductive material in the first and second openings and on the dielectric mask, then by implementing a step of planarization of the electrically conductive material with stoppage on the dielectric mask.

8. The method according to claim 1, in which the stack further comprises an electrically conductive layer such that the second layer is arranged between the electrically conductive layer and the first layer, and in which the first etching of the stack is implemented such that the first openings are made through the electrically conductive layer and delimit portions of the electrically conductive layer forming a part of each of the second electrodes.

9. The method according to claim 1, further comprising, between the production of the first electrically conductive portions and the elimination of the substrate, the implementation of a transfer of the stack and the substrate onto a support such that the stack is arranged between the substrate and the support.

10. The method according to claim 9, in which the transfer of the stack and the substrate is implemented with electrically conducive connection elements electrically connecting the first and second electrodes of the diodes to the support during the implementation of the transfer of the stack and the substrate onto the support.

11. The method according to claim 9, in which the step of eliminating the substrate is implemented collectively for several devices with light emitting and/or light receiving diodes each including a stack and a substrate transferred onto a support, and in which the supports of the devices with light emitting and/or light receiving diodes are made integral on a maintaining wafer before the implementation of the step of eliminating the substrate.

12. The method according to claim 1, in which the first openings are produced such that they form a grid pattern surrounding each of the diodes.

13. The method according to claim 1, in which the etching steps are implemented such that:
- each of the first openings delimiting the p-n junctions of light emitting diodes has a smallest dimension, at the level of a bottom wall formed in the substrate, which is less than a smallest dimension of the first opening at the level of an interface between the substrate and the stack, and/or
- each of the first openings delimiting the p-n junctions of light receiving diodes has a smallest dimension, at the level of the bottom wall formed in the substrate, which is greater than the smallest dimension of the first opening at the level of the interface between the substrate and the stack.

14. The method according to claim 1, further comprising, after the step of elimination of the substrate, the implementation of a step of depositing at least one anti-reflective and/or metal layer on the collimation grid, and/or the implementation of a treatment increasing the roughness of the collimation grid.

\* \* \* \* \*